(12) United States Patent
Kim

(10) Patent No.: US 6,589,825 B2
(45) Date of Patent: Jul. 8, 2003

(54) METHOD FOR RE-FORMING SEMICONDUCTOR LAYER IN TFT-LCD

(75) Inventor: Dong-Hee Kim, Gyeongsangbuk-Do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/139,353

(22) Filed: May 7, 2002

(65) Prior Publication Data

US 2002/0168803 A1 Nov. 14, 2002

(30) Foreign Application Priority Data

May 9, 2001 (KR) .................................... 2001-0025233

(51) Int. Cl.[7] .............................................. H01L 21/84
(52) U.S. Cl. ............................. 438/151; 438/149; 438/4
(58) Field of Search ........................... 438/4, 149, 151, 438/479, 517, 152, 155, 309, 311, 282, 298, 910, 412, 164

(56) References Cited

U.S. PATENT DOCUMENTS 6,504,175 B1 * 1/2003 Mei et al. ...................... 257/66
2001/0012648 A1 * 8/2001 Lee ............................... 438/149
2002/0009835 A1 * 1/2002 Chen et al. ................... 438/149

* cited by examiner

*Primary Examiner*—Long Pham
*Assistant Examiner*—Aneta Cieslewicz
(74) *Attorney, Agent, or Firm*—Morgan, Lewis & Bockius LLP

(57) ABSTRACT

A method for re-forming a semiconductor layer of a thin film transistor-liquid crystal display device, including the steps of forming a gate electrode on a substrate, and forming a first gate insulation film on the gate electrode and the substrate; forming a semiconductor layer on the first gate insulation film; etching the semiconductor layer to remove the semiconductor layer if the formed semiconductor layer is defective; etching an upper portion of the first gate insulation film to a certain thickness damaged as the interface is exposed to the air by the etching of the semiconductor layer; forming a second gate insulation film on the remaining first gate insulation film; and forming a semiconductor layer on the second gate insulation film. Since the gate insulation film is partially etched at the upper portion, rather than being completely etched, and re-formed to a planned thickness and then the semiconductor layer is re-formed, the electric characteristics of the display device are prevented from being degraded by the damage to the interface of the gate insulation film.

11 Claims, 4 Drawing Sheets

ETCHING

ETCHING

METHOD FOR RE-FORMING SEMICONDUCTOR LAYER IN TFT-LCD

The present invention claims the benefit of Korean Patent Application No. 25233/2001 filed in Korea on May 9, 2001, which is hereby incorporated by reference.

BACKGROUND OF THE INVENTION

1. Field of the Invention

The present invention relates to a method for re-forming the semiconductor layer of a thin film transistor liquid crystal display (TFT-LCD) device, and more particularly, to a method for re-forming a semiconductor layer of a thin film transistor-liquid crystal display device without damaging a gate by removing a semiconductor layer and a gate insulation film in a manner that a gate is not exposed, and re-depositing an insulation film and a semiconductor layer.

2. Description of the Related Art

In general, a thin film transistor liquid crystal display (TFT-LCD) device is formed such that a metal gate electrode is formed contacting a substrate, a gate insulation film and a semiconductor layer are deposited on the gate electrode, and the semiconductor layer is patterned to form an active region.

In conventional method for depositing the semiconductor layer, if the semiconductor layer was deposited having an electric characteristic different from an expected value due to an abnormality of the process, the substrate including the erroneously deposited semiconductor layer was usually discarded, or only the semiconductor layer was etched and a semiconductor layer was newly deposited, or the semiconductor layer and an insulation film were etched, and then, an insulation film and a semiconductor layer were newly deposited, thereby re-forming the semiconductor layer.

This method for re-forming a semiconductor layer of TFT-LCD device will now be described with reference to the accompanying drawings.

FIGS. 1A through 1C are sectional views sequentially showing a fabrication process of a method for re-forming a semiconductor layer of a TFT-LCD device in accordance with one conventional art process.

As shown in FIGS. 1A through 1C, a method for re-forming a semiconductor layer of a TFT-LCD device in accordance with conventional art includes the steps of depositing a metal on the surface of a substrate 1, patterning the metal through a photo-etching process to form a gate electrode 2 at a portion thereon, and sequentially depositing a gate insulation film 3, an amorphous silicon layer 4, an N$^+$ amorphous silicon layer 5 doped with a high density N type impurity on the entire upper surface of the substrate 1 (refer to FIG. 1A), etching the N$^+$ amorphous silicon layer 5 and the amorphous silicon layer 4 if the deposited amorphous silicon layer 4 or the N$^+$ amorphous silicon layer are defective, and exposing the gate insulation film 3 (refer to FIG. 1B); and re-depositing an amorphous silicon layer 6 and an N$^+$ amorphous silicon layer 7 on the entire upper surface of the resulting structure, to re-form the semiconductor layer (refer to FIG. 1C). The above method will now be described in more detail.

First, as shown in FIG. 1A, a metal is deposited on an entire upper surface of the substrate 1, on which a photoresist is coated, exposed and developed to form a photoresist pattern thereon.

Next, the exposed metal is etched by an etching process in which the photoresist pattern is used as a mask, so as to form the gate electrode 2 on the substrate 1.

Then, an insulation film is deposited at an entire upper surface of the resulting structure to form the gate insulation film 3, on which the amorphous silicon layer 4 is deposited, and then the N$^+$ amorphous silicon layer 5 is deposited on the entire upper surface thereof.

Therefore, for the sequentially deposited amorphous silicon layer 4 and the N$^+$ amorphous silicon layer 5, its electric characteristics may be changed depending on process conditions such as a flow amount of a gas, a pressure and a temperature during deposition. If the electric characteristics are different from expected characteristics, the process is suspended.

That is, as shown in FIGS. 1A and 1B, if the deposited amorphous silicon layer 4 and the N$^+$ amorphous silicon layer 5 are defective, the N$^+$ amorphous silicon layer 5 and the amorphous silicon layer 4 are sequentially etched through a selective etching process.

At this time, as the amorphous silicon layer 4 is etched, an upper portion of the gate insulation film 3 is exposed to air. As the selective etching process proceeds, the interface of the gate insulation film 3 is also etched during the process of etching of the amorphous silicon layer 4, even though the etching amount of film 3 is small.

Thus, if the characteristics of the interface of the gate insulation film 3 is changed as the gate insulation film 3 is exposed to air or etched, the electric characteristics of the thin film transistor are degraded.

As shown in FIG. 1C, after the amorphous silicon layer 4 and the N+ amorphous silicon layer 5 are etched, the amorphous silicon layer 6 and the N$^+$ amorphous silicon layer 7 are deposited on the entire upper surface of the gate insulation film 3, whereby the semiconductor layer is reformed.

Even after the process, if the amorphous silicon layer 6 and the N$^+$ amorphous silicon layer 7 are defective, the etching and re-deposition process are repeatedly performed. However, if re-formed amorphous silicon layer 6 and N$^+$ amorphous silicon layer 7 are used, electric characteristics are inevitably degraded (as compared to a normal fabrication process) due to the interface characteristics degradation of the gate insulation film 3.

FIGS. 2A through 2C are sectional views sequentially showing a fabrication process of a method for reforming a semiconductor layer of TFT-LCD device in accordance with another conventional art method.

FIGS. 2A through 2C illustrate another conventional method for re-forming a semiconductor layer of TFT-LCD device that includes the steps of depositing a metal on the surface of a substrate 1, patterning the metal through a photolithography process to form a gate electrode 2 at one portion of the upper surface of the substrate 1, and sequentially depositing a gate insulation film 3, an amorphous silicon layer 4 and an N$^+$ amorphous silicon layer 5 with high density N type impurity doped thereon at the entire upper surface of the substrate with the gate electrode 2 formed thereon (refer to FIG. 2A); etching the N$^+$ amorphous silicon layer 5, the amorphous silicon layer 4 and the gate insulation film 3 if the deposited amorphous silicon layer 4 and N$^+$ amorphous silicon layer 5 are defective, thus exposing the gate electrode 2 (refer to FIG. 2B); and depositing a gate insulation film 8, an amorphous silicon layer 6 and an N$^+$ amorphous silicon layer 7 on an entire upper surface of the resulting structure, to re-form a semiconductor layer (refer to FIG. 2C).

The method for re-forming a semiconductor layer of TFT-LCD device in accordance with another conventional art will now be described in more detail.

First, as shown in FIG. 2A, the metal is deposited on an entire upper surface of the substrate 1, and the metal is patterned by a photolithography process so as to form the gate electrode 2 at one portion of the upper surface of the substrate 1.

Next, an insulation film is deposited on an entire upper surface of the resulting structure to form the gate insulation film 3, the amorphous silicon layer 4 is deposited on the entire upper surface of the gate insulation film 3, and then the $N^+$ amorphous silicon layer 5 is deposited on the entire upper surface of the amorphous silicon layer 4.

Accordingly, the electric characteristics of the sequentially deposited amorphous silicon layer 4 and the $N^+$ amorphous silicon layer 5, may be changed depending on processing conditions, such as a flow amount of a gas, a pressure and a temperature during deposition. If the electric characteristics are different from expected characteristics, the process is suspended.

That is, as shown in FIGS. 2A and 2B, if the deposited amorphous silicon layer 4 and the N+ amorphous silicon layer 5 are defective, the $N^+$ amorphous silicon layer 5, the amorphous silicon layer 4 and the gate insulation film 3 are sequentially etched through a selective etching process.

By the etching process, the defective $N^+$ amorphous silicon layer 5 and the amorphous silicon layer 4 can be removed, and as mentioned above, the gate insulation film 3 is also removed in order to prevent an interface of the gate insulation film 3 from being damaged.

However, the surface of the gate electrode 2 exposed by the etching process may be damaged.

Moreover, if the gate electrode 2 is made of a material such as Molybdenum, which is easily damaged by etching, the gate electrode 2 would be damaged. If change occurs, the gate electrode 2 should be removed, and the process should start from formation of the gate electrode 2.

If fabricating must start from gate electrode 2, fabrication costs are increased and fabrication time is also increased. Thus, productivity is degraded.

Meanwhile, with reference to FIG. 2C, after the amorphous silicon layer 4, the $N^+$ amorphous silicon layer 5 and the gate insulation film 3 are etched, the gate insulation film 8, the amorphous silicon layer 6 and the $N^+$ amorphous silicon layer 7 are sequentially deposited on the gate electrode 2 and the rest of the upper surface of the substrate 1. The semiconductor layer is re-formed.

Therefore, if the amorphous silicon layer 6 and the $N^+$ amorphous silicon layer 7 are defective the etching and re-deposition processes should be repeatedly performed. If the processes are performed by starting re-formation of the gate electrode in order to prevent the damage of the gate electrode, fabrication costs increase, and productivity is degraded.

SUMMARY OF THE INVENTION

Accordingly, the present invention is directed to a method for re-forming semiconductor layer in TFT-LCD.

An object of the present invention is to provide a method for re-forming a semiconductor layer of a thin film transistor liquid crystal display device that is capable of minimizing fabrication cost and time as well as preventing an interface damage of a gate insulation film.

To achieve these and other advantages in accordance with the purpose of the present invention, as embodied and broadly described herein, there is provided a method for re-forming a semiconductor layer of a thin film transistor liquid crystal display device, including the steps of forming a gate electrode on the surface of a substrate, and forming a first gate insulation film on the gate electrode and the substrate; forming a semiconductor layer on the first gate insulation film; etching the semiconductor layer to remove the semiconductor layer if the formed semiconductor layer is defective; etching an upper portion of the first gate insulation film to a certain thickness, damaged as the interface portion is exposed to the air by the etching of the semiconductor layer; forming a second gate insulation film on the remaining first gate insulation film; and forming a semiconductor layer on the second gate insulation film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute apart of this specification, illustrate embodiments of the invention and together with the description serve to explain the principles of the invention.

In the drawings.

DETAILED DESCRIPTION OF THE PREFERRED EMBODIMENTS

Figure 1A:
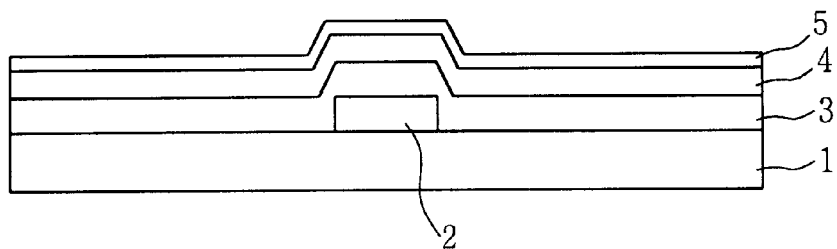
FIGS. 1A through 1C are sectional views sequentially showing a fabrication process of a method for re-forming a semiconductor layer of TFT-LCD device in accordance with one conventional art method.
Figure 1B:
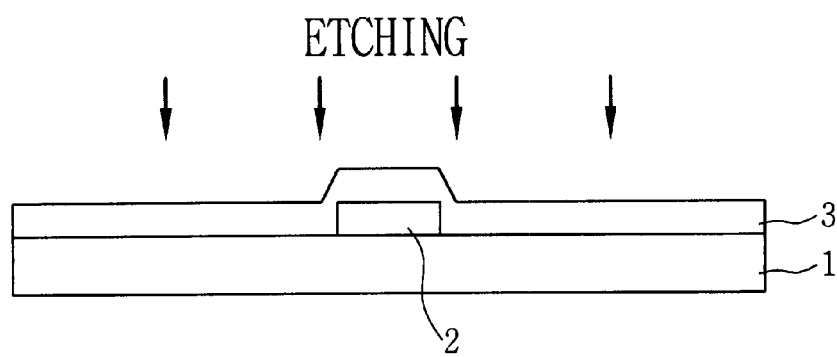
Figure 1C:
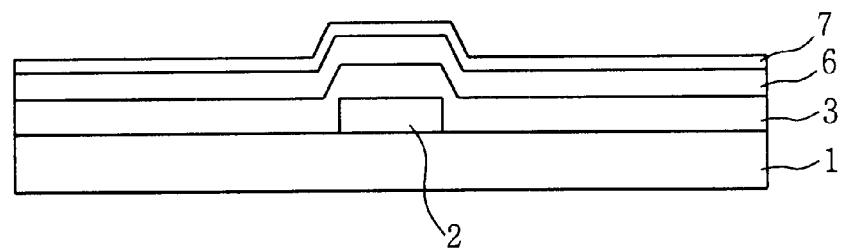
Figure 2A:
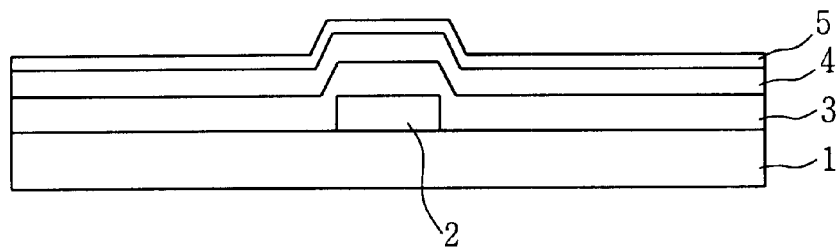
FIGS. 2A through 2C are sectional views sequentially showing a fabrication process of a method for re-forming a semiconductor layer of TFT-LCD device in accordance with another conventional art method.
Figure 2B:
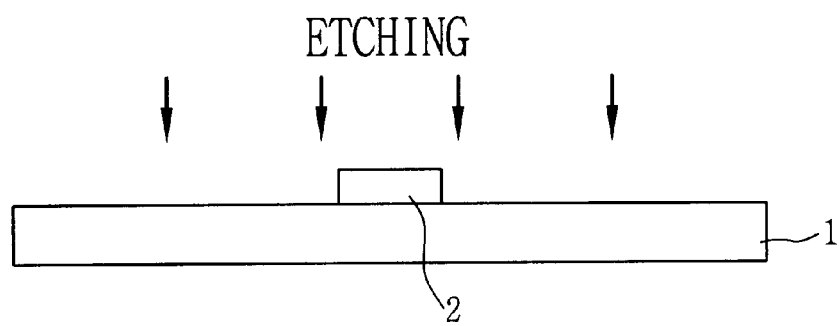
Figure 2C:
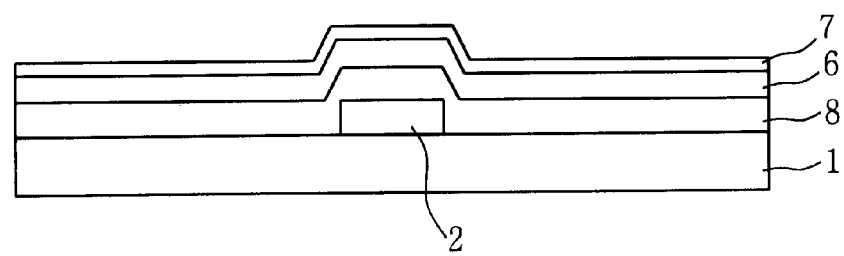

Reference will now be made in detail to the preferred embodiments of the present invention, examples of which are illustrated in the accompanying drawings.

FIGS. 3A through 3F are sectional views sequentially showing a fabrication process of a method for re-forming a semiconductor layer of TFT-LCD device in accordance with a preferred embodiment of the present invention.

As shown in FIGS. 3A through 3F, a method for re-forming a semiconductor layer of TFT-LCD device in accordance with a preferred embodiment of the present invention includes the steps of forming a gate electrode 2 on a substrate 1, and sequentially depositing a first gate insulation film 3, an amorphous silicon layer 4 and an N+ amorphous silicon layer 5 on the gate electrode 2 and the substrate 1 (refer to FIG. 3A); exposing the first gate insulation film 3 by sequentially etching the $N^+$ amorphous silicon layer 5 and the amorphous silicon layer 4 if the deposited $N^+$ amorphous silicon layer 5 and the amorphous silicon layer 4 are defective (refer to FIG. 3B); etching the entire surface of the exposed first gate insulation film to a certain thickness (refer to FIG. 3C); depositing a second gate insulation film on the remaining first gate insulation film to form gate insulation films 3 and 9 with expected thickness (refer to FIG. 3D); depositing amorphous silicon layer 6 and an $N^+$ amorphous silicon layer 7 at an entire upper surface of the gate insulation film 9 (refer to FIG. 3E); and patterning the N+ amorphous silicon layer 7 and the amorphous silicon layer 6 to form an active region if they have been normally deposited, forming a source 10, a drain 11 and a channel region through a depositing and patterning process of a metal, depositing a passivation layer 12 at an entire upper surface of the resulting structure, forming a contact hole at the passivation layer 12 to partially expose the upper portion of the drain 11, and forming an ITO electrode 13 contacting the drain 11 exposed through the contact hole.

The method for re-forming a semiconductor layer of TFT-LCD device in accordance with the preferred embodiment of the present invention will now be described in more detail.

Figure 3A:
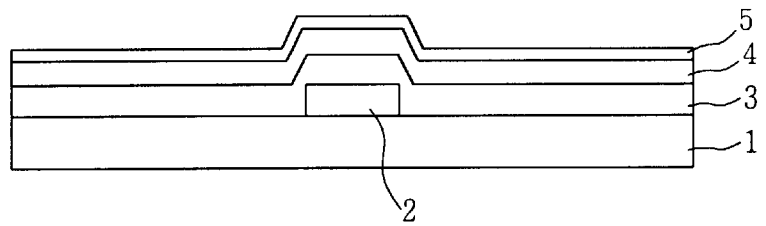
FIGS. 3A through 3F are sectional views sequentially showing a fabrication process of a method for re-forming a semiconductor layer of TFT-LCD device in accordance with a preferred embodiment of the present invention.

First, as shown in FIG. 3A, a metal is deposited on the surface of the substrate 1, and the metal is patterned by a photolithography process, to form the gate electrode 2.

Next, the first gate insulation film 3 is deposited on the gate electrode 2 and the rest of the upper surface of the substrate 1, and the amorphous silicon layer 4 and the N+ amorphous silicon layer 5 are sequentially deposited on the entire upper surface of the first gate insulation film 3.

In the process of depositing the amorphous silicon layer 4 and the N+ amorphous silicon layer 5, the layers may be defective due to abnormalities of various process variables, such as a flow amount of a gas, a pressure, and a temperature or both.

If the planned amorphous silicon layer or the N+ amorphous silicon layer have different characteristics from that of an actual amorphous silicon layer 4 and the N+ amorphous silicon layer 5, the erroneously deposited amorphous silicon layer 4 and the N+ amorphous silicon layer 5 should be removed and re-formed again.

Figure 3B:
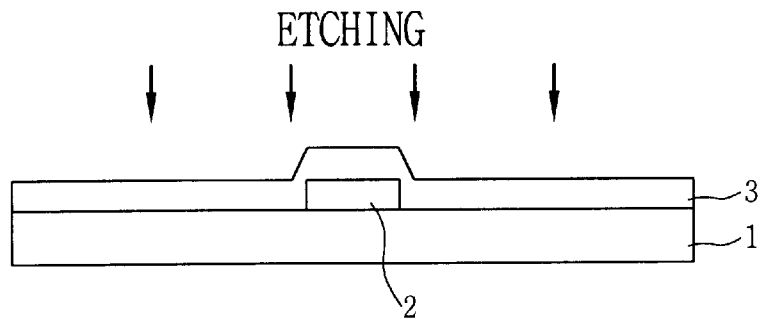

Next, as shown in FIG. 3B, the amorphous silicon layer 4 or the N+ amorphous silicon layer 5 are erroneously deposited, the N+ amorphous silicon layer 5 and the amorphous silicon layer 4 are etched to be removed.

However, the interface of the first gate insulation film 3 is exposed in the air and the interface is damaged during the etching process. In this state, if the amorphous silicon layer and the N+ amorphous silicon layer are deposited, it results in the degradation of its electric characteristics.

Figure 3C:
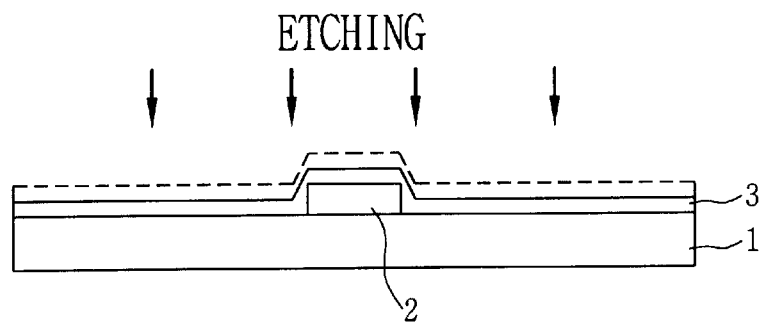

As shown in FIG. 3C, the damaged interface portion of the first gate insulation film 3 as exposed is etched.

As discussed earlier, if the gate insulation film 3 is completely removed, the gate electrode 2 would be damaged and have to be formed again, which results in the degradation of productivity due to the increase in fabrication cost and time delay.

Figure 3D:
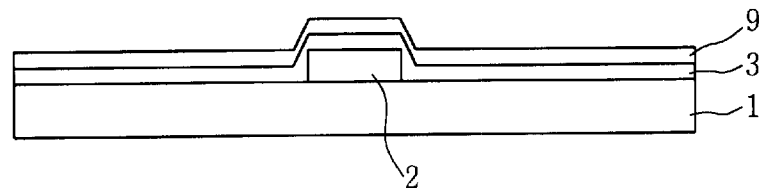

Therefore, as shown in FIG. 3D, the second gate insulation film 9 is deposited on the upper portion of the first gate insulation film 3, to form gate insulation films 3 and 9 with planned thickness. Thus, the interface of the gate insulation films is not damaged and desired electric characteristics can be obtained.

If the first gate insulation film 3 is etched just as deep as the damaged interface region, the second gate insulation film 9 can be deposited as thick as the etched first gate insulation film, so as to restore the damage of the interface of the first gate insulation film 9.

However, for the sake of convenience of processes and a process margin, the etching thickness of the first gate insulation film 3 is made to be half of the thickness of the initially planned gate insulating film and the second gate insulation film 9 to be deposited later is as thick as the half of the thickness of the gate insulation film 3. Ror the sake of reducing processing time, on the other hand, the etching thickness of the first gate insulation film 3 is one-fourth the initially planned thickness of the gate insulation film 3 and the second gate insulation film to be deposited later is made to be as thick as one-fourth the initially intended thickness of the gate insulation film 3, so that gate insulation films 3 and 9 having the desired characteristics can be obtained quicker.

For example, according to the invention, if the thickness of the first gate insulation film 3 is initially 4000 Å, 2000 Å can be etched, and then, the second gate insulation film 9 is deposited as thick as 2000 Å again. In order to prevent a prolonged process time period due to the large amount of etching and depositing, in another embodiment of the invention 1000 Å can be etched and then the second gate insulation film 9 can be deposited as thick as 1000 Å.

The etching thickness of the first gate insulation film 3 and the deposition thickness of the second gate insulation film 9 are determined in considering variables of etching and deposition conditions. The thickness therefore, are not limited to the range as in the above-described embodiment of the present invention.

Figure 3E:
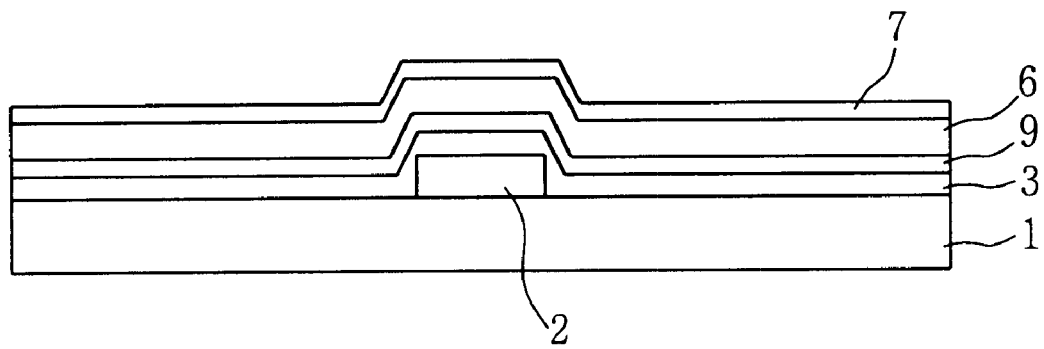

Next, as shown in FIG. 3E, the amorphous silicon layer 6 and the N+ amorphous silicon layer 7 are deposited on the entire upper surface of the gate insulation film 9.

In this manner, the amorphous silicon layer 6 and the N+ amorphous silicon layer 7 having the electric characteristics as initially planned can be formed.

If the electric characteristics of the newly formed amorphous silicon layer 6 and the N+ amorphous silicon layer 7 are different from the expected values, the processes from FIG. 3B to FIG. 3E are repeatedly performed until a semiconductor layer having the expected characteristics is obtained.

The semiconductor layer re-forming method is not limited to the thin film transistor liquid crystal display device and can be adopted to re-forming of a general semiconductor layer. The embodiment of a general semiconductor layer re-forming method according to the present invention includes the steps of preparing a substrate, forming a gate electrode, forming a first gate insulation film on the substrate, forming a semiconductor layer on the first gate insulation film, checking the semiconductor layer, removing the semiconductor layer if, upon checking the semiconductor layer is defective, etching the upper portion of the first gate insulation film to a certain thickness, forming a second gate insulation film on the remaining first gate insulation film, and forming a semiconductor layer on the newly formed gate insulation film.

Figure 3F:
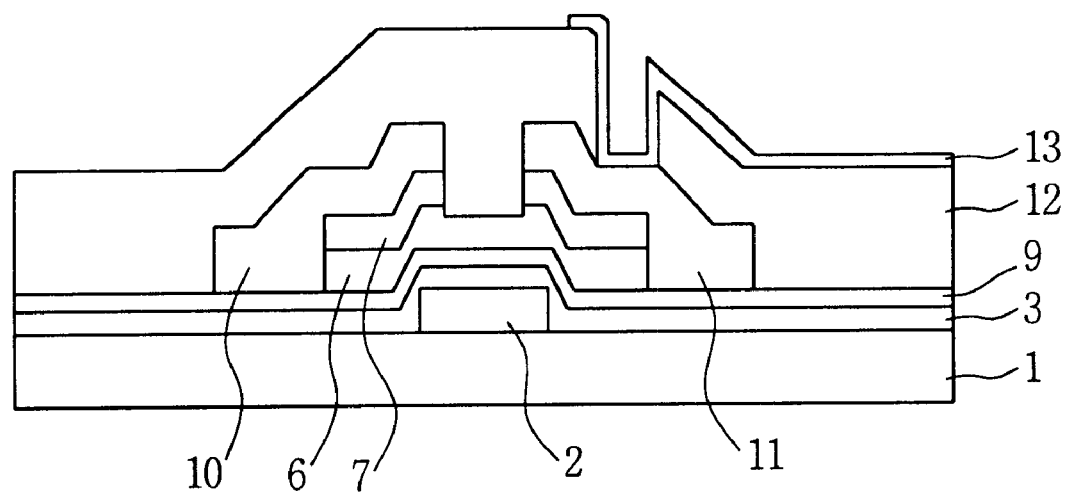

Next, as shown in FIG. 3F, after the amorphous silicon layer 6 and the N+ amorphous silicon layer 7, that is, the semiconductor layer, are normally deposited, the N+ amorphous silicon layer 7 and the amorphous silicon layer 6 are patterned by the photolithography process, to form an active region.

After a metal is deposited at the entire upper surface of the resulting structure, the deposited metal is patterned by the photolithography process, so as to form a source 10 and a drain 11 that are spaced apart for a certain distance and positioned up to the side of the active region.

Thereafter, the N+ amorphous silicon layer 7 exposed between the source 10 and the drain 11 is etched to expose the amorphous silicon layer 6, thereby forming a channel region.

A passivation layer 12 is deposited at the entire upper surface of the resulting structure and a contact hole is formed at the passivation layer 12 by the photolithography process to partially expose the upper portion of the drain 11.

Then, ITO is deposited at the entire upper surface of the resulting structure and patterned by the photolithography process, to thereby form an ITO electrode 12 contacting the drain 11 exposed through the contact hole.

Accordingly, the method for re-forming a semiconductor layer of a thin film transistor-liquid crystal display device has many advantages.

For example, since the gate insulation film is partially etched at the upper portion rather than being completely etched, and re-formed to a planned thickness and then the semiconductor layer is re-formed, degradation by the damage to the interface of the gate insulation film, the electric characteristics of the display device 15 are prevented.

In addition, compared to the method in which the gate insulation film is completely etched and a gate insulation film and a semiconductor layer are newly restored only to damage the gate electrode, so inevitably requiring re-formation from the gate electrode to the semiconductor layer, the time loss and the fabrication cost can be reduced.

It will be apparent to those skilled in the art that various modifications and variations can be made to the method for re-forming the semiconductor layer of a thin film transistor liquid crystal display TFT-LCD device of the present invention without departing from the spirit or scope of the invention. Thus, it is intended that the present invention cover the modifications and variations of this invention provided they come within the scope of the appended claims and their equivalents.

What is claimed is:

1. A method for re-forming a semiconductor layer of a thin film transistor-liquid crystal display device, comprising the steps of:

forming a gate electrode on a substrate, and forming a first gate insulation film on the gate electrode and the substrate;

forming a first semiconductor layer on the first gate insulation film;

etching the first semiconductor layer to remove the semiconductor layer;

etching an upper portion of the first gate insulation film;

forming a second gate insulation film on a remaining portion of the first gate insulation; and forming a second semiconductor layer on the second gate insulation film.

2. The method of claim 1, wherein the step of forming a second semiconductor layer comprises:

forming an amorphous silicon layer on the second gate insulation film; and forming an N⁺ amorphous silicon layer on the amorphous silicon layer.

3. The method of claim 1, further comprising the step of checking the first semiconductor layer and removing the semiconductor layer if the formed semiconductor layer is defective.

4. The method of claim 1, wherein the first gate insulation film and the second gate insulation film are made of the same material.

5. The method of claim 1, wherein a thickness of the second gate insulation film formed on the first gate insulation film is as thick as the etched upper portion of the first gate insulation film.

6. The method of claim 1, further comprising:

patterning the second semiconductor layer and forming an active region;

forming a source and a drain; and forming a transparent electrode.

7. The method of claim 1, wherein the etched upper portion of the first gate insulation film is more than a half of the thickness of the first gate insulation film.

8. The method of claim 1, wherein the etched upper portion of the first gate insulation film is less than a half of the thickness of the first gate insulation film.

9. A method for re-forming a semiconductor layer comprising the steps of:

preparing a substrate;

forming a gate electrode;

forming a first gate insulation film on the substrate;

forming a first semiconductor layer on the first gate insulation film;

checking the first semiconductor layer;

removing the first semiconductor layer if the semiconductor layer is defective upon said checking;

etching an upper portion of the first gate insulation film to a certain thickness;

forming a second gate insulation film on a remaining portion gate insulation film; and forming a second semiconductor layer on the second gate insulation film.

10. The method of claim 9, wherein the first gate insulation film and the second gate insulation film are made of the same material.

11. The method of claim 9, wherein a thickness of the second gate insulation film formed on the first gate insulation film is as thick as the etched upper portion of the first gate insulation film.

* * * * *